United States Patent
Kim et al.

[11] Patent Number: 6,138,892
[45] Date of Patent: Oct. 31, 2000

[54] METHOD FOR MOUNTING AN INTEGRATED CIRCUIT FROM A TAPE CARRIER PACKAGE ON A PRINTED CIRCUIT BOARD

[75] Inventors: Choul-Su Kim; Woo-Sik Kim; Sung-Beom Sim; Masaharu Sukue; Byung-Woo Woo, all of Suwon, Rep. of Korea

[73] Assignee: SamSung Electronics Co., Ltd., Suwon, Rep. of Korea

[21] Appl. No.: 09/038,958

[22] Filed: Mar. 12, 1998

[30] Foreign Application Priority Data

Mar. 13, 1997 [KR] Rep. of Korea ........................ 97-8420

[51] Int. Cl.⁷ ............................ B23K 31/00; B23K 31/02
[52] U.S. Cl. ...................................... 228/102; 228/180.21
[58] Field of Search .................................... 228/105, 207, 228/180.21, 180.22, 223, 254, 102, 6.2, 9

[56] References Cited

U.S. PATENT DOCUMENTS

| | | |
|---|---|---|
| 4,116,376 | 9/1978 | Delorme et al. . |
| 4,135,630 | 1/1979 | Snyder et al. ............................... 214/1 |
| 4,151,945 | 5/1979 | Ragard et al. ............................... 228/6 |
| 4,600,137 | 7/1986 | Comerford ............................... 228/102 |
| 4,979,290 | 12/1990 | Chiba ...................................... 29/840 |
| 4,998,342 | 3/1991 | Bonnell et al. ........................... 29/840 |
| 5,042,709 | 8/1991 | Cina et al. ............................... 228/105 |
| 5,046,953 | 9/1991 | Shreeve et al. . |
| 5,168,432 | 12/1992 | Murphy et al. .......................... 361/421 |
| 5,235,407 | 8/1993 | Spigarelli et al. . |
| 5,240,170 | 8/1993 | Nishida et al. ..................... 228/180.21 |
| 5,299,279 | 3/1994 | Roberts .................................... 392/421 |
| 5,303,122 | 4/1994 | Adams et al. . |
| 5,313,368 | 5/1994 | Volz et al. . |
| 5,366,573 | 11/1994 | Bayer et al. .............................. 156/64 |
| 5,373,985 | 12/1994 | Chiba et al. ......................... 228/180.1 |
| 5,432,303 | 7/1995 | Turek et al. ............................. 174/259 |
| 5,471,310 | 11/1995 | Spigarelli et al. . |
| 5,563,380 | 10/1996 | Rostoker et al. . |
| 5,647,750 | 7/1997 | Tran et al. . |
| 5,652,462 | 7/1997 | Matsunaga et al. . |
| 5,667,129 | 9/1997 | Morita et al. . |

Primary Examiner—Patrick Ryan
Assistant Examiner—C Newsome
Attorney, Agent, or Firm—Robert E. Bushnell, Esq.

[57] ABSTRACT

A method for mounting an integrated circuit having a plurality of leads on a PCB. In order to mount the integrated circuit having a plurality of leads on the PCB, foreign substance on the PCB is first removed and a flux is simultaneously spread over the lead patterns formed on the PCB. After that, by aligning the leads of the integrated circuit with lead patterns on the PCB on which the flux is spread, some leads of the integrated circuit is temporarily fixed to the corresponding lead patterns of the PCB. After soldering the leads of the integrated circuit to the lead patterns of the PCB by radiating an optical beam on the entire whole surface, the soldered PCB is cooled, thereby mounting the integrated circuit on the PCB.

13 Claims, 7 Drawing Sheets

METHOD FOR MOUNTING AN INTEGRATED CIRCUIT FROM A TAPE CARRIER PACKAGE ON A PRINTED CIRCUIT BOARD

CLAIM FOR PRIORITY

This application makes reference to, incorporates the same herein, and claims all benefits accruing under 35 U.S.C. §119 from an application for A METHOD FOR MOUNTING AN INTEGRATED CIRCUIT earlier filed in the Korean Industrial Property Office on the 13$^{rd}$ of March 1997, and there duly assigned Serial No. 8420/1997, a copy of which application is annexed hereto.

BACKGROUND OF THE INVENTION

1. Technical Field

The present invention relates to a method for mounting an integrated circuit having a plurality of leads on a printed circuit board, and particularly to an apparatus and process of effectively and efficiently mounting an integrated circuit of a tape carrier package (TCP) type on a printed circuit board (PCB).

2. Related Art

Most semiconductor electronic devices are now packaged with their integrated circuit components mounted on printed circuit boards (PCB). Integrated circuit packages are generally planar and contain a plurality of leads projecting laterally and generally downward therefrom. These leads, in turn, are soldered to respective circuit pads on a printed circuit board (PCB). Packing techniques for integrated circuit (IC) chips of high functions such as 8086 of 8-bit processor to 80386, 80486 and 80586 of 32-bit processors through 80286 of 16-bit processors, are generally known to satisfy demands for miniaturization in the semiconductor industry. As the chip densities and sophistication of electronic components become greater, however, the precision required in mounting and connecting the leads of the IC chip to the printed circuit board (PCB) substrate become more critical.

Contemporary IC mounting techniques on printed circuit boards (PCB) are disclosed, for example, in U.S. Pat. No. 4,116,376 for Method Of Mounting Integrated Circuit Chips On A Substrate And Apparatus For Carrying Out The Method issued to Delorme et al., U.S. Pat. No. 5,046,953 for Method And Apparatus For Mounting An Integrated Circuit On A Printed Circuit Board issued to Shreeve et al., U.S. Pat. No. 5,235,407 for System For Placement And Mounting Of Fine Pitch Integrated Circuit Devices issued to Spigarelli et al., Adams, Jr. et al., U.S. Pat. No. 5,303,122 for Printed Circuit Board Having A Commonized Mounting Pad Which Different Sized Surface Mounted Devices Can Be Mounted issued to Adams, Jr. et al., U.S. Pat. No. 5,313,368 for Electrical Connections Between Printed Circuit Boards And Integrated Circuits Surface Mounted Thereon issued to Volz et al., U.S. Pat. No. 5,471,310 for System For Placement And Mounting Of Fine Pitch Integrated Circuit Devices issued to Spegarelli et al., U.S. Pat. No. 5,563,380 for Apparatus For Mounting Integrated Circuit Chips On A Mini-Board issued to Rostoker et al., U.S. Pat. No. 5,652,462 for Multilevel Semiconductor Integrated Circuit Device issued to Matsunaga et al., and U.S. Pat. No. 5,667,129 for IC Component Mounting Method And Apparatus issued to Morita et al. Generally, the IC chip is directly mounted on the printed circuit board (PCB), and the leads of the IC chip are soldered or electrically connected to the substrate lead pattern by using direct wire bonding. However, direct wire bonding has not always been reliable. Precise alignment which requires expensive equipment is necessary to prevent solder bridging between the leads of the IC chip and the substrate lead pattern. Moreover, the leads of IC chip are not always uniformly connected to the substrate lead pattern. These production difficulties reduce efficiency and increase cost.

Recent technology for mounting IC chips of higher functions such as Pentium (TM) processor on printed circuit boards (PCB) has been developed. One example of this technology is disclosed in U.S. Pat. No. 5,647,750 for Socket For A Tape Carrier Package issued to Tran et al., in which the IC chip is housed in a tape carrier package (TCP), and is mounted directly on a dielectric tape such as polyimide. Typically, the IC of TCP type has a very small compartment which includes 320 pins and has a spacing of 0.2 mm between the leads. The IC chip is formed without wire bonding which is used in conventional IC chips. As a result, as the size of the IC chip is small, the size of the printed circuit board (PCB) can be even smaller. While the recent method of mounting the IC chip of TCP type eliminates the use of wire bonding, there is still a problem of efficiency. The mounting technique, as I have observed, takes too much time, as the flux must be spread on the lead pattern on the PCB one by one. Moreover, during manufacture, the alignment time between the leads of the IC chip and the lead patterns of the PCB is generally slow, and therefore results in inefficient production.

SUMMARY OF THE INVENTION

Accordingly, it is therefore an object of the present invention to provide an apparatus and method of mounting an integrated circuit (IC) of a tape carrier package (TCP) on a printed circuit board (PCB) with greater time and cost efficiency.

It is also an object to provide a method of reducing production time required for spreading flux simultaneously on lead patterns of a printed circuit board (PCB).

It is another object to provide a method of accurately aligning leads of an integrated circuit (IC) with lead patterns of a printed circuit board (PCB) by a vision system without direct intervention of a worker.

These and other objects of the present invention can be achieved by an apparatus and method of mounting an integrated circuit (IC) chip having a plurality of leads on a printed circuit board (PCB), in which foreign substances on the PCB are first removed and flux is simultaneously spread over the lead patterns formed on the PCB. After that, the leads of the IC chip are aligned with the lead patterns on the PCB on which the flux is spread, so that some leads of the IC chip are temporarily soldered to the corresponding lead patterns. After the IC chip is aligned by a holding block and all leads of the IC chip are permanently soldered to the lead patterns on the PCB by radiating an optical beam on the entire surface, the soldered PCB and the holding block are cooled, thereby completing the mounting of the IC chip on the PCB.

Preferably, after recognizing the position of the lead patterns on the PCB where the flux is to be spread, the flux is spread on the lead patterns on the PCB simultaneously, using a flux stamp in which the lead pattern is carved. In addition, for temporarily soldering the leads of the IC chip on the lead patterns of the PCB after alignment, the position where the IC chip is to be mounted on the PCB on which the flux is spread is recognized, the IC chip is sucked by a vacuum tool and then the leads of the IC chip are aligned to the lead patterns on the PCB on which the flux is spread. After that, alignment is accurately performed using a vision system, and portion of the leads of the IC chip is temporarily soldered to the lead patterns of the PCB so as to prevent the leads of the IC chip from misalignment. It is possible to recognize the position where the IC chip is to be mounted on the PCB on which the flux is spread, using a recognition mark located on the PCB. Selectively, conductive bond may be used to spread on part of the PCB where the IC chip is located. Preferably, xenon (Xe) is used as a source for generating the optical beam.

The present invention is more specifically described in the following paragraphs by reference to the drawings attached only by way of example.

BRIEF DESCRIPTION OF THE DRAWINGS

A more complete appreciation of the present invention, and many of the attendant advantages thereof, will become readily apparent as the same becomes better understood by reference to the following detailed description when considered in conjunction with the accompanying drawings in which like reference symbols indicate the same or similar components, wherein.

DETAILED DESCRIPTION OF THE PREFERRED EMBODIMENT

Figure 1:
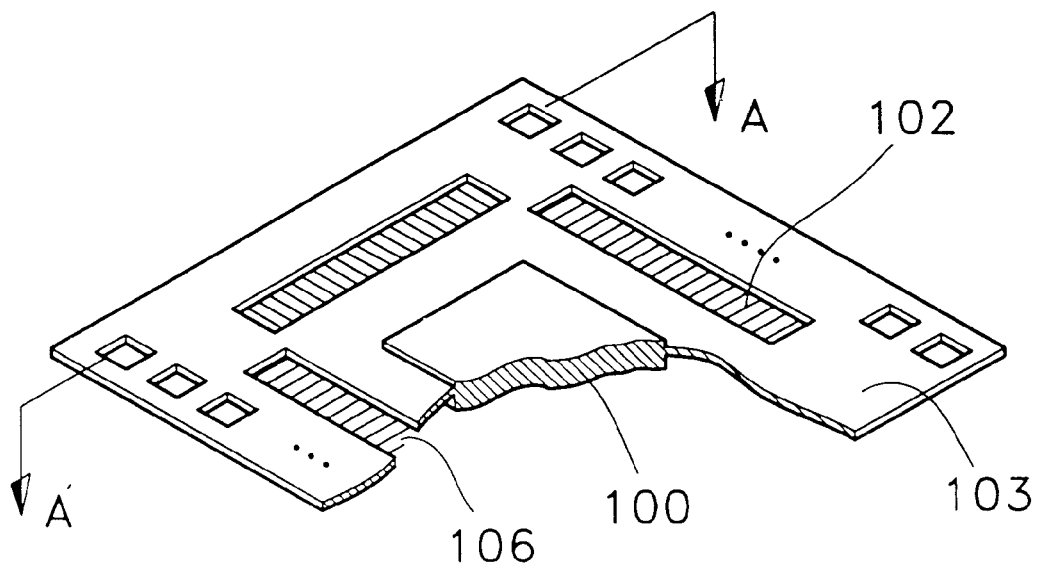
FIG. 1 is a perspective and partial view of an integrated circuit (IC) of a tape carrier package (TCP) type.

Referring now to the drawings and particularly to FIG. 1, which is a perspective and partial view of an integrated circuit (IC) of a tape carrier package (TCP) type. The tape carrier package (TCP), which can be fabricated by known tape automated bonding (TAB) techniques, comprises a flexible carrier tape 103 which is made from a dielectric material such as polyimide. An IC chip 100 is mounted on the tape 103 and has leads 102 extending from each side of the IC chip 100 on the back side of the polyimide tape 103 in a pattern to maintain insulation between the leads 102 and provide protection from external shock. Moreover, slots 106 are formed at positions spaced apart from the edges on the polyimide tape 103 so as to face each edge of the IC chip 100, and portion of the leads 102 are exposed. The integrated circuit (IC) of TCP type for mounting on a printed circuit board (PCB) also has a plastic carrier for protection purposes.

Figure 2:
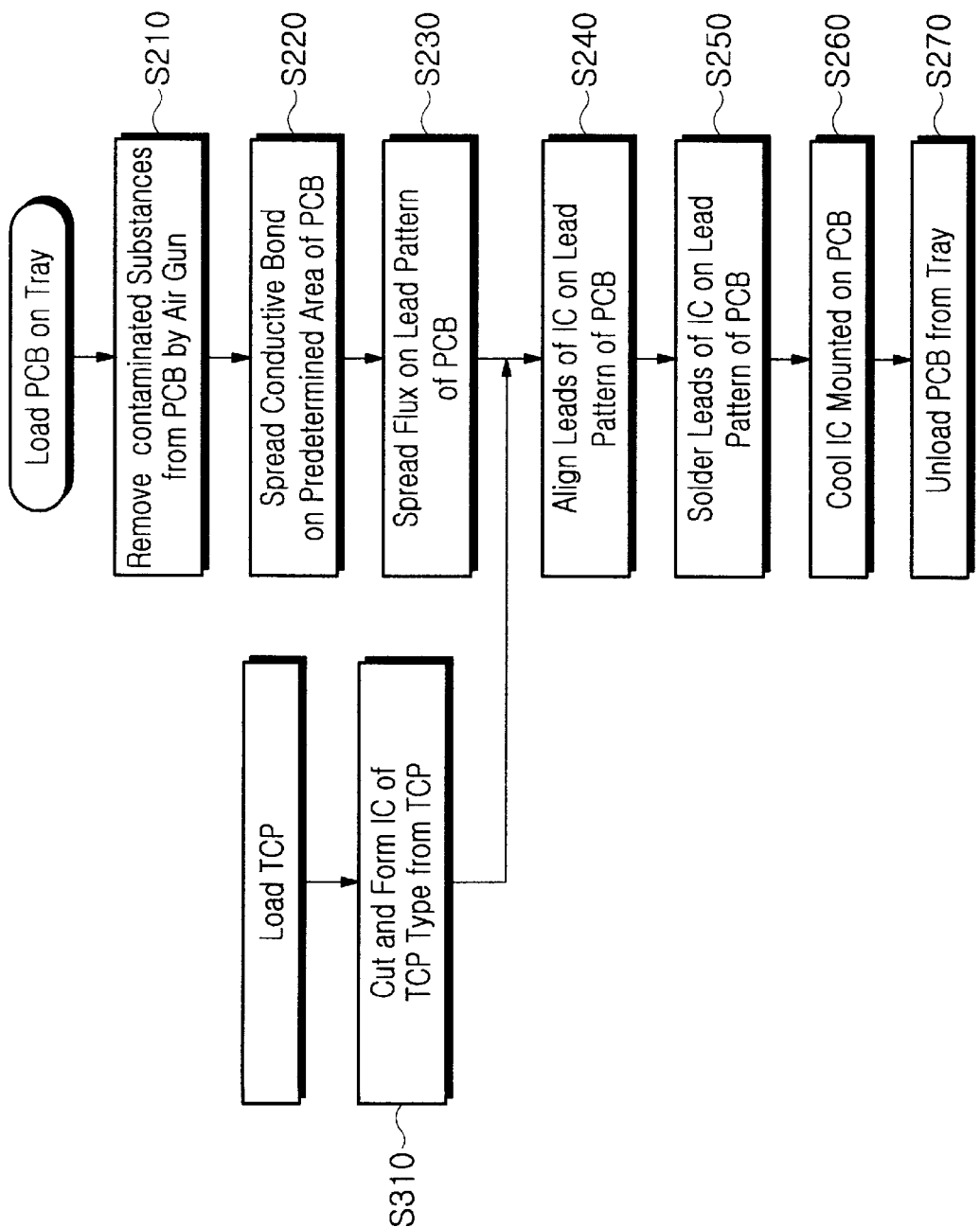
FIG. 2 is a flowchart of a process for mounting an integrated circuit (IC) of TCP type on a printed circuit board (PCB)

An earlier method for mounting an integrated circuit (IC) of TCP type on a printed circuit board (PCB) is described with reference to FIG. 2 hereinbelow. Referring to FIG. 2, the printed circuit board (PCB) is first loaded on a tray. The contaminating substance stuck on the PCB is removed from the PCB using an air gun at step 210. After that, conductive bond is spread as much as a predetermined area from the central region of the PCB where an IC chip is to be mounted at step 220. A flux is evenly spread on the lead pattern of the PCB corresponding to the portion where the leads of the IC chip are to be soldered using nozzle at step 230. After that, the IC chip which is cut and formed from a tape carrier package (TCP) by separate processes at step 310 is transported to the PCB on which the flux is spread and the leads of the IC chip is aligned to correspond accurately to the lead patterns of the PCB at step 240.

Continuously, a hot bar at a high temperature presses the leads of the IC chip located on the lead patterns of the PCB so as to solder the leads of the IC chip on the lead patterns of the PCB at step 250. Since solder has previously been coated on the lead patterns of the PCB during the previous process, it is possible to perform the soldering operation. After cooling the soldered PCB at step 260, the PCB on which the IC chip is mounted for a next process is unloaded from a tray at step 270. This earlier method for mounting an integrated circuit (IC) chip, as I have noted, has a problem in that too much time is required for mounting operation, as the flux is spread on the lead patterns of the PCB one by one. Moreover, as the worker compares the leads of the IC chip with the lead patterns of the PCB, too much time for alignment is required which results in inefficient production.

Figure 3A:
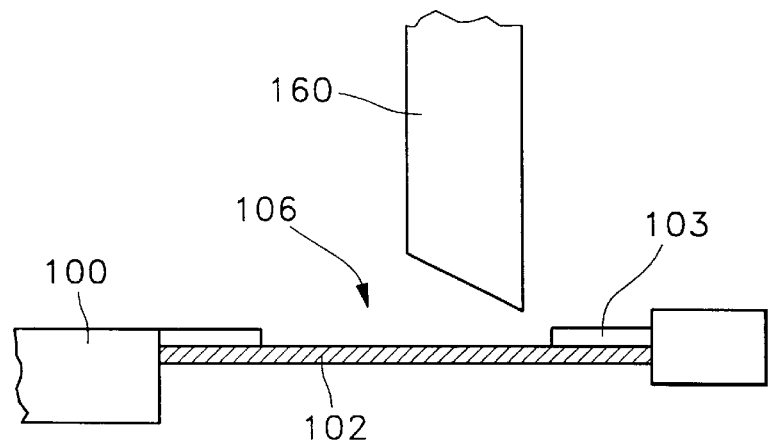
FIGS. 3A, 3B and 3C are diagrams illustrating a process in which leads of an integrated circuit (IC) are cut and formed.
Figure 3B:
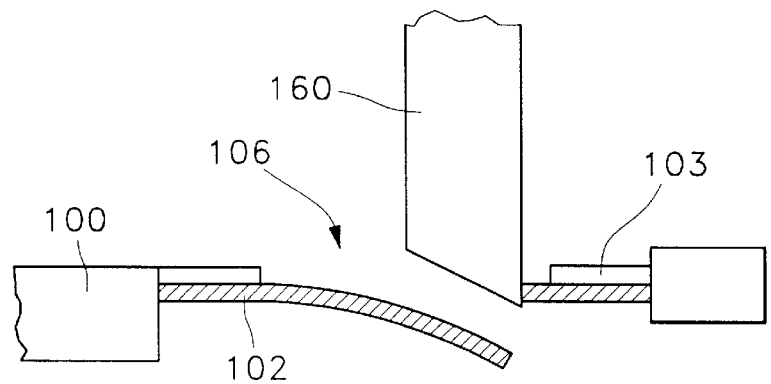
Figure 3C:
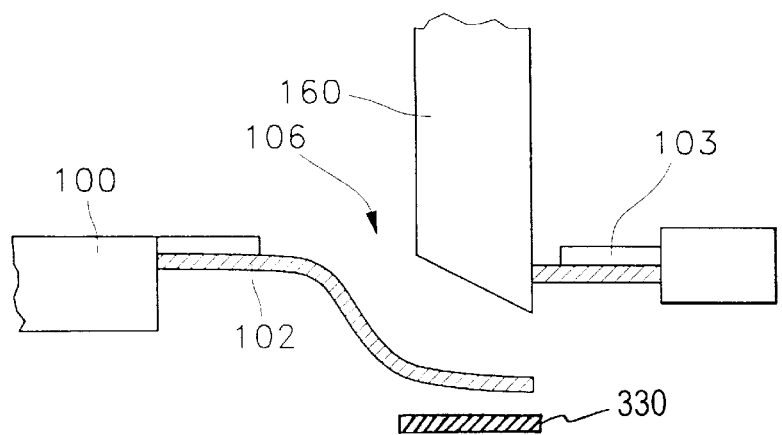

Turning now to FIGS. 3A–3C to FIG. 7 which illustrates an apparatus and method of mounting an integrated circuit (IC) chip of TCP type on a printed circuit board (PCB) according to the principles of the present invention. FIGS. 3A, 3B and 3C are diagrams illustrating a process in which the leads of an integrated circuit (IC) are cut and formed. For example, as shown in FIG. 3A, the cutting and forming unit 160 is inserted into the slot 106 of the IC chip 100 mounted on polyimide tape 103 to cut a plurality of leads 102 simultaneously as shown in FIG. 3B. The cutting and forming unit 160 has a predetermined curvature at a cutting edge so as to forge the shape of the leads 102 with the same curvature for electrical connection to the lead pattern 330 of the printed circuit board (PCB) 110 as shown in FIG. 3C.

Figure 4A:
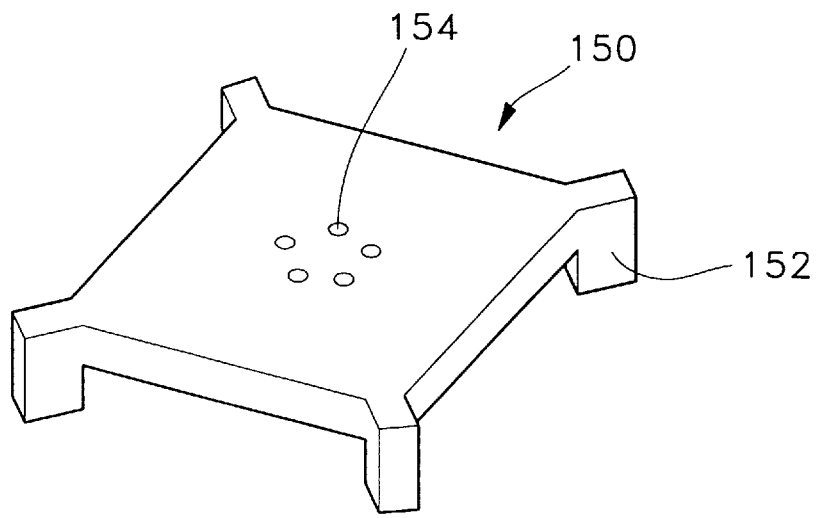
FIG. 4A is a perspective view of a holding block for holding an integrated circuit (IC) of TCP type.
Figure 4B:
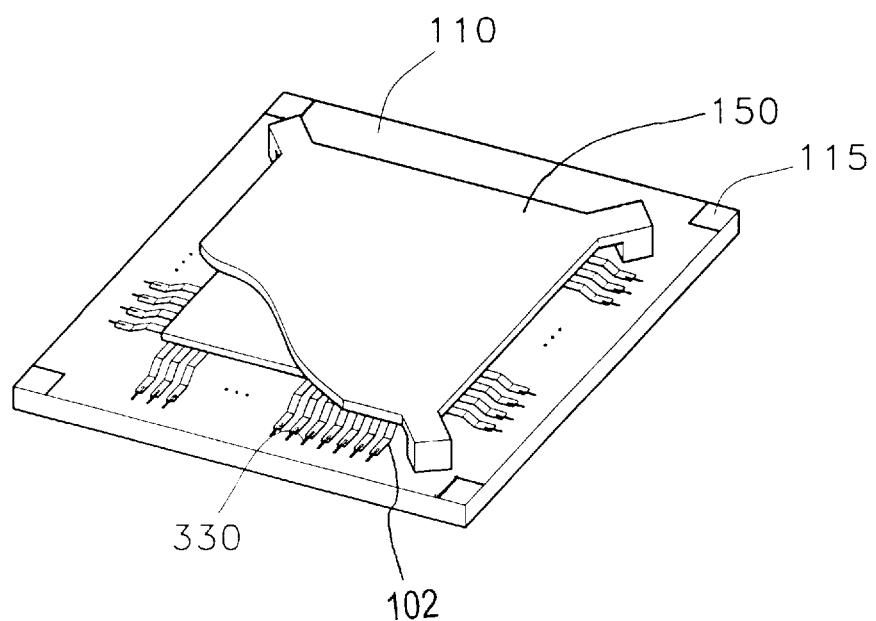
FIG. 4B is a perspective and partial view of the holding block for holding an integrated circuit (IC) of TCP type mounted on a printed circuit board (PCB)
Figure 4C:
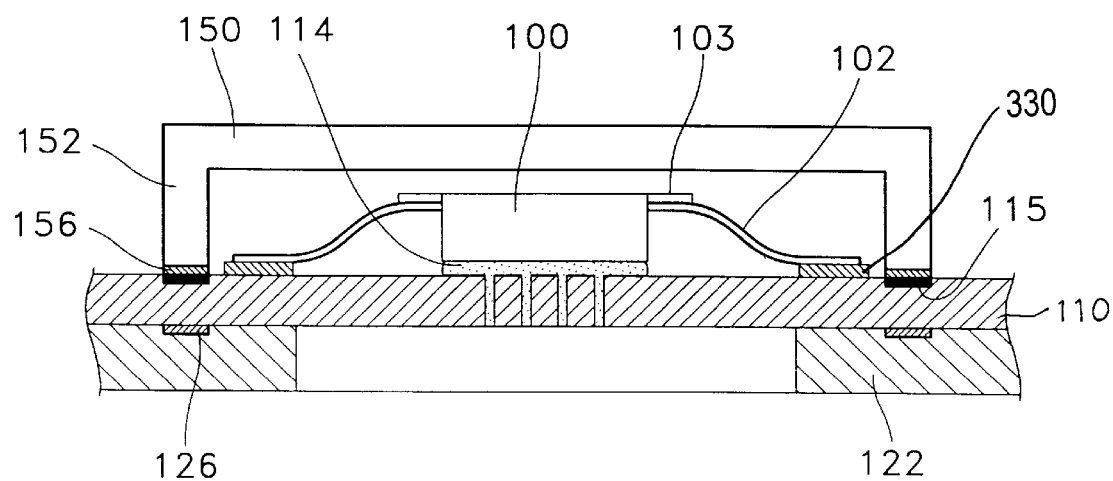
FIG. 4C is a sectional view illustrating operational relations of the holding block, the integrated circuit (IC), the printed circuit board (PCB) and a magnet fixing jig.
Figure 5:
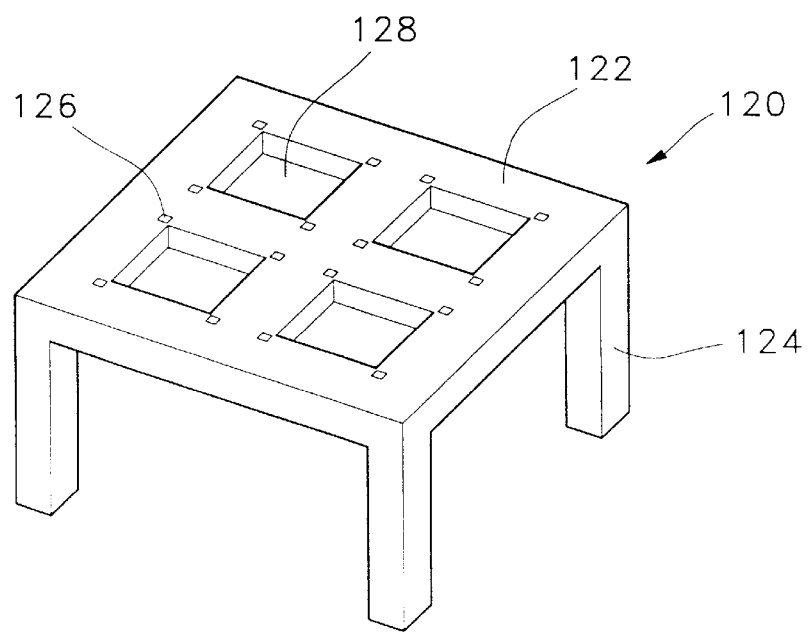
FIG. 5 is a perspective view of the magnet fixing jig.

FIGS. 4A–4C provide perspective views of a holding block 150 for holding an integrated circuit (IC) of TCP type mounted on a printed circuit board (PCB) and operational relations of the holding block 150, the integrated circuit (IC) 100, the printed circuit board (PCB) 110 and a magnet fixing jig 120. FIG. 5 is a perspective view of a magnetic fixing jig 120 having a flat board plate 122, four supporting legs 124 and four rectangular grooves 128 each having buried magnets 126 at respective corner for affixing a corresponding printed circuit board (PCB) 110 thereon when mounting an integrated circuit (IC) chip 100. In particular, the holding block 150 has a rectangular shape as shown in FIG. 4A with a predetermined thickness corresponding to the shape of the IC chip 100, and supporting portions 152. A plurality of openings 154 are perforated at the central portion of the holding block 150 and disposed over the IC chip 100 to create suction when a vacuum pump is used to maintain the IC chip 100 in position for mounting purposes. FIG. 4B shows a partial view of the holding block 150 with relation to the lead pattern 330 of the printed circuit board (PCB) 110. When the PCB 110 having four recognition marks 115 is placed over a rectangular (or square) groove 128 of the magnet fixing jig 120, the four magnets 126 buried beneath the flat board plate 122 of the magnet fixing jig 120 hold the PCB 110 and the holding block 150 in position as shown in FIG. 4C.

Figure 6:
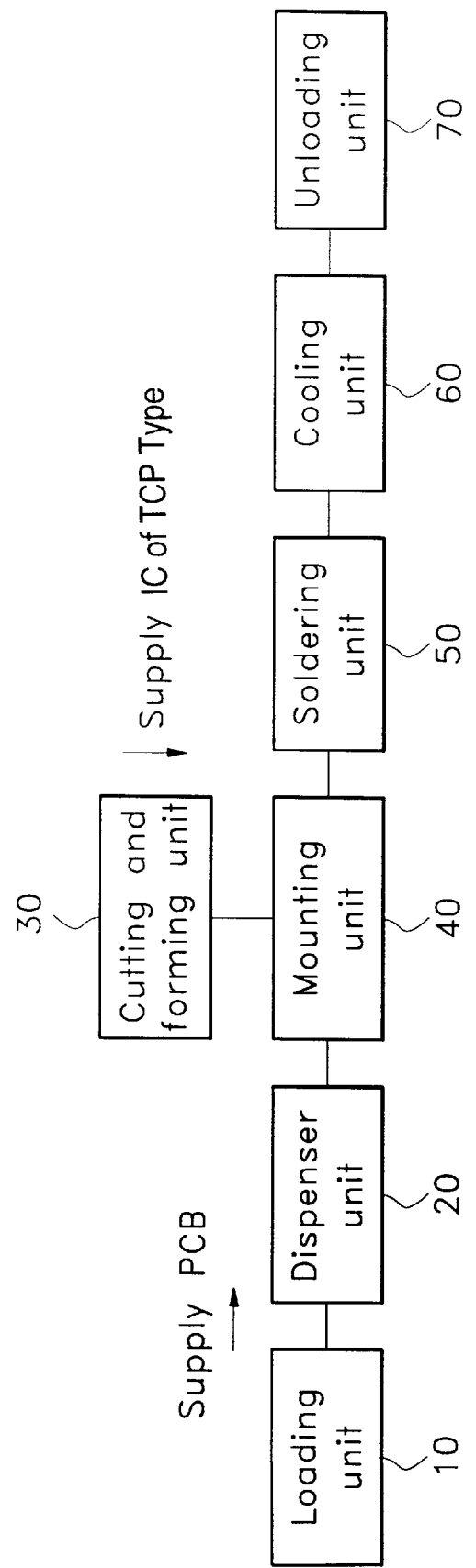
FIG. 6 is a block diagram of an apparatus for mounting an integrated circuit (IC) of TCP type on a printed circuit board (PCB) according to the principles of the present invention.

Refer now to FIG. 6, which illustrates an apparatus for mounting an integrated circuit (IC) chip of TCP type on a printed circuit board (PCB) constructed according to the principles of the present invention. As shown in FIG. 6, the apparatus includes a loading unit 10, a dispenser unit 20, a cutting and forming unit 30, a mounting unit 40, a soldering unit 50, a cooling unit 60 and an unloading unit 70. The loading unit 10 is first used to load an array of PCBs 1 10 on a magnet fixing jig 120. The dispenser unit 20 then spreads a conductive bond over the portion of the PCB 110 corresponding to an integrated circuit (IC) chip 100 to be mounted. The cutting and forming unit 30 is used to cut the IC chip 100 from a tape carrier package (TCP) in a predetermined size and thereby forming a plurality of leads. The mounting unit 40 then spreads the flux on the lead pattern of the PCB 110 over which the conductive bond is spread, and aligns the leads of the IC chip 110 to the lead pattern 330 of the PCB 110. The soldering unit 50 is used to solder the IC chip 100 mounted on the PCB 110 with an optical beam of Xenon. The cooling unit 60 is used to cool the soldered PCB 110; and the unloading unit 70 is used to unload the PCB 110 from the magnet fixing jig 124.

Figure 7:
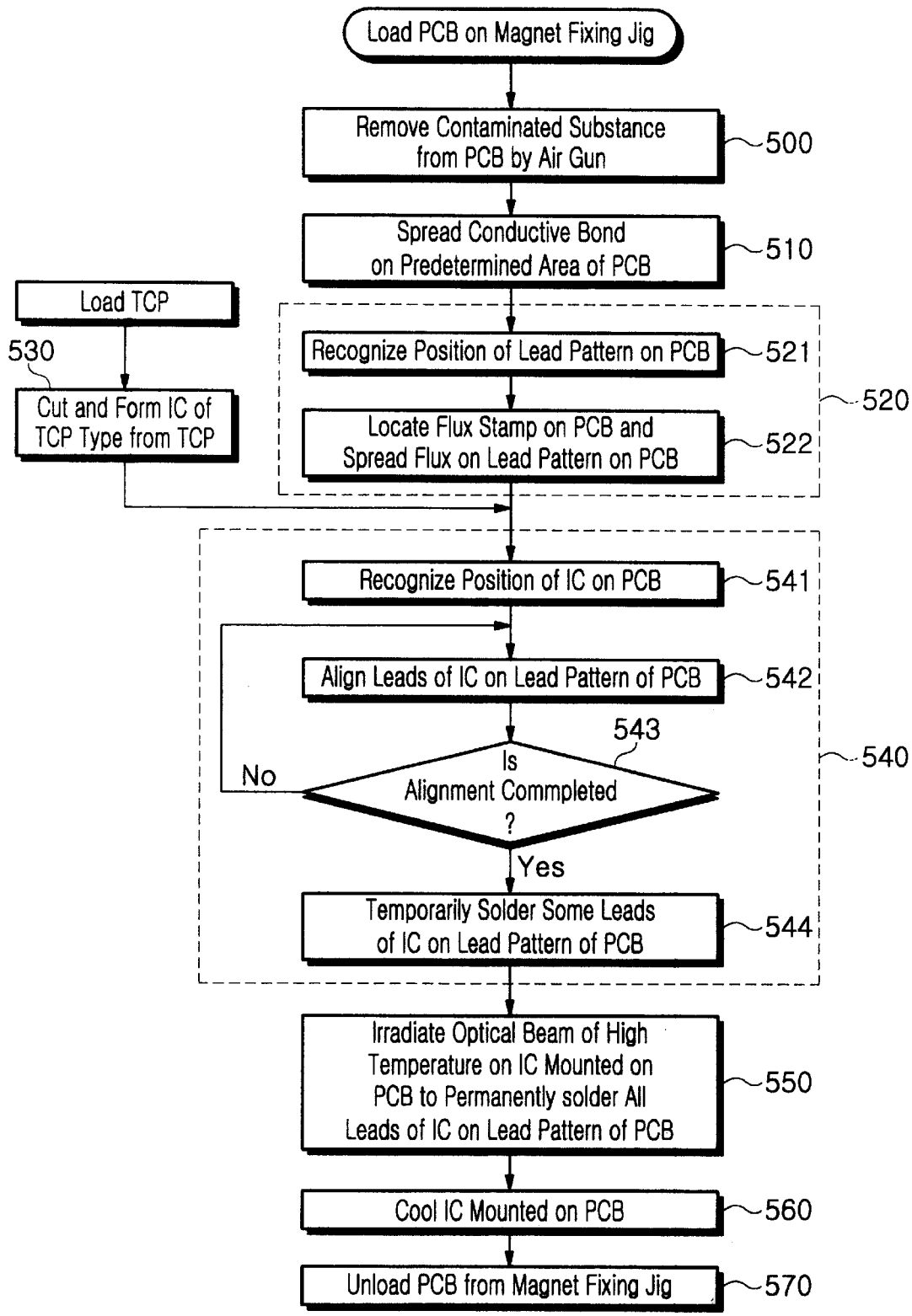
FIG. 7 is a flowchart of a process for mounting an integrated circuit (IC) of TCP type on a printed circuit board (PCB) according to the principles of the present invention.

Refer to FIG. 7, which illustrates a process of mounting an integrated circuit (IC) 100 of TCP type on a printed circuit board (PCB) 110 according to the principles of the present invention. As shown in FIG. 7, contaminated substance stuck on the PCB 110 supplied to the loading unit 10 is removed using an air gun at step 500. The PCB 110 supplied as a preferred embodiment of the present invention is an array of PCBs in which four PCBs each having the same size for positioning over the four grooves 128 of the magnet fixing jig 120. The array of PCBs 110 is transported to the magnetic fixing jig 120 where it is fixed by the magnets 12 of the magnet fixing jig 120, as shown in FIG. 5.

As shown in FIG. 5, the magnet fixing jig 120 includes a flat board plate 122 having a rectangular shape and supporting legs 124 formed at each edge of the flat board plate 122. On the flat board plate 122, four rectangular grooves 128 are formed corresponding to the array PCB 110. The rectangular groove 128 faces a pattern unit of the PCB 110. Moreover, magnets 126 for fixing the holding block are buried in a predetermined depth at the edges of the rectangular groove 128. For reference, as shown in FIG. 4B, a pair of recognition marks 115 are formed at the edges of the array PCB 110 in a diagonal direction. The recognition marks 115 are supposed to be reference marks when aligning the holding block 150 on the PCB 110.

After the PCB 110 is positioned on the magnet fixing jig 120, the conductive bond 114 is spread over a predetermined area from the central region of the PCB 110 where the semiconductor IC chip 100 is disposed by a dispenser (not illustrated) located in the dispenser unit 20 at step 510. At this time, the conductive bond 114 is preferably spread over a predetermined area of the PCB 110 corresponding to 60% of the size of the semiconductor IC chip 100.

After the conductive bond is spread over the predetermined area of the PCB 110, the flux is simultaneously spread over the lead pattern 330 of the PCB 110 on which the conductive bond is spread and which is transported at step 520. The positions of the lead pattern of the PCB 110 are recognized at step 521. After dipping a flux stamp in which the lead pattern of the PCB 110 is carved in a flux tank which is filled with the flux and then dipping the surface of the lead pattern of the flux stamp in the flux, the flux stamp is located on the lead pattern of the PCB 110. When the flux stamp is stamped on the PCB 110, the flux is spread on the lead pattern of the PCB 110 corresponding to the positions where the leads 102 of the IC chip 100 are soldered at step 522. High adhesive flux is used as a lubricant for lubricating the soldering operation. After spreading the flux on one lead pattern on the array PCB 110, the flux is similarly spread over the lead patterns of the remaining three PCBs 110.

Meanwhile, the IC chip 100 which is received in the plastic carrier and then supplied is cut and formed in a predetermined size suitable to the lead pattern on the PCB 110 at step 530. As shown in FIGS. 3A and 3B, the cutting and forming unit 160 lowers to around the outer end of the slot 106 and cuts a plurality of leads 102 at a time. At this time, the polyimide tape 103 which is located outside of the slot 106 is excluded. After that, as shown in FIG. 3C, the leads which are cut are formed as a shape each having a predetermined curvature so that they can properly be attached to the PCB 110.

After adhering the IC chip 100 to the holding block 150, the integrated circuit is moved on the lead pattern of the PCB 110 so as to be aligned. And then, some leads of the IC chip 100 are temporarily soldered to the lead patterns of the PCB 110, prior to performing soldering operation at step 540.

In order to align the leads 102 of the IC chip 100 after the cutting and forming operations, the position on the PCB 110 where the IC chip 100 is to be mounted is recognized by using the recognition mark 115 on the PCB 110 on which the flux is spread and which is transported at step 541. After that, the leads 102 of the IC chip 100 are aligned with the lead patterns of the PCB 110 at step 542. In this situation, the alignment can be automatically performed due to the images regarding the PCB 110 and the IC chip 100 which are transmitted from a camera of a vision system. In other words, the position of the PCB 110 fixed at the magnet fixing jig 120 is recognized using the recognition mark 115 of the PCB 110, and then the formed leads 102 of the IC chip 100 are accurately aligned so as to face the upper part of the lead patterns of the PCB 110.

The vision system determines whether the leads 102 of the IC chip 100 which are aligned at step 542 coincide with the lead patterns of the PCB 110 at step 543. When the alignment is completed as a result of the determination, as shown in FIG. 4B, the IC chip 100 is lowered on the lead pattern of the PCB 110 together with the holding block 150, by manipulating a vacuum pump. As shown in FIG. 4, as magnetic substance 156 which is attached to the lower part of the supporting portion 152 formed at each edge of the holding block 150 and the four magnets 126 which are buried in the magnet fixing jig 120 are contacted and fixed, the PCB 110 which is located in the middle can be tightly fixed. Accordingly, any twist or movement of the holding block 150 which can occur when mounting the IC chip 100 on the PCB 110 can be prevented. On the other hand, in the case that the alignment is not completed, after returning to step 542, the aligning process is repeatedly performed. In the case that the alignment is not completed in spite of the aligning process which is repeatedly performed, the vision system recognizes that the forming of the leads 102 cannot properly be performed and considers this IC chip and PCB as defective.

The holding block 150 is adhered by the vacuum pump and is transported to the position where the IC chip 100 which is cut and formed is located. As shown in FIG. 4A, the holding block 150 has a rectangular shape having a predetermined thickness corresponding to the shape of the semiconductor IC chip 100 which is cut and formed. At the central portion of the rectangular shape, the openings 154 are included so that the IC chip 100 positioned inside of the holding block 150 can be adhered to the holding block 150 using the vacuum pump provided inside of the mounting unit 40. At this time, the rectangular groove (not illustrated) corresponding to the size of the semiconductor IC chip 100 is formed at the back side of the holding block 150 so as to adhere stably to the IC chip 100. At each edge of the holding block 150, the supporting portion 152 having a predetermined length is established. As shown in FIG. 4C, the magnetic substance 156 of a predetermined thickness is attached to each lower part of the supporting portion 152. The magnetic substance is used for the magnets 126 located at the magnet fixing jig 120 to fix the holding block 150 during the aligning step.

Prior to transporting the IC chip 100 mounted on the PCB 110 which finishes the alignment to the soldering unit 50, some leads 102 of the IC chip 100 are temporarily soldered to the corresponding lead patterns on the PCB 110 at step 544. This way misalignment of the leads 102 of the IC chip 100 which are aligned with the lead patterns can be prevented.

After some leads 102 of the IC chip 110 are temporarily soldered on the lead pattern of the PCB 110, an optical beam of xenon is irradiated directly onto the IC chip 100 mounted on the PCB 110 fixed by the magnet fixing jig 120 and the holding block 150 in order to perform a permanent soldering operation at a high temperature of 300° C. (step 550). At this time, the optical beam radiates evenly into the overall lead patterns on the PCB 110 which is to be soldered for an even soldering. This novel solder technique is different from conventional solder methods, as this method solders without directly pressing the lead pattern on the PCB 110 for purposes of avoiding damages to the leads 102 of the IC chip 100 and preventing shorts.

The PCB 110 is then transported to the cooling unit 60, and the holding block 150 and the PCB 110 having a high temperature due to the soldering are cooled at step 560. After that, the holding block 150 is lifted from the PCB 110 by the vacuum pump and is unloaded at step 570, and the remaining three PCBs of the array PCB 110 repeatedly perform the above-described process.

As described above, according to the method for mounting an integrated circuit (IC) of TCP type on a printed circuit board (PCB) according to the present invention, as the flux is spread at one time by the flux stamp in which the lead pattern on the PCB is carved, the operational time for spreading the flux can be greatly reduced. Moreover, when aligning the integrated circuit (IC) chip, the leads of the integrated circuit (IC) chip which is formed are automatically aligned with the lead patterns on the PCB by using the recognition mark on the PCB, thereby reducing the time for aligning the integrated circuit (IC) chip when compared to the manual alignment, and enhancing productivity.

While there have been illustrated and described what are considered to be preferred embodiments of the present invention, it will be understood by those skilled in the art that various changes and modifications may be made, and equivalents may be substituted for elements thereof without departing from the true scope of the present invention. In addition, many modifications may be made to adapt a particular situation to the teaching of the present invention without departing from the central scope thereof Therefore, it is intended that the present invention not be limited to the particular embodiment disclosed as the best mode contemplated for carrying out the present invention, but that the present invention includes all embodiments falling within the scope of the appended claims.

What is claimed is:

1. A method, comprising:
    mounting an integrated circuit having a plurality of leads on a printed circuit board;
    removing contaminating substance from said printed circuit board;
    spreading a flux on a lead pattern of said printed circuit board;
    aligning the leads of said integrated circuit with the lead pattern of said printed circuit board over which the flux is spread, and then temporarily fixing some leads of said integrated circuit to the lead pattern of said printed circuit board;
    soldering all leads of said integrated circuit to the lead pattern of said printed circuit board by radiating an optical beam of high intensity onto the entire surface; and
    cooling said printed circuit board having said integrated circuit mounted thereon.

2. The method of claim 1, further comprising a step of recognizing the position of the lead pattern on said printed circuit board where the flux is to be spread, prior to spreading the flux.

3. The method of claim 2, further comprised of said flux being spread using a flux stamp in which the lead pattern of said printed circuit board is carved.

4. The method of claim 1, further comprised of said step of aligning and temporarily fixing the leads of said integrated circuit comprises the steps of:
    recognizing the position where said integrated circuit is to be mounted on said printed circuit board over which the flux is spread;
    aligning the leads of said integrated circuit with the lead pattern on said printed circuit board over which the flux is spread;
    determining whether alignment is accurately completed using a vision system; and
    temporarily soldering some leads of said integrated circuit to the lead pattern of said printed circuit board to prevent the leads of said integrated circuit from misalignment.

5. The method of claim 4, further comprised of the position of said printed circuit board where said integrated circuit is to be mounted being recognized using a recognition mark on said printed circuit board.

6. The method of claim 1, further comprising a step of spreading a conductive bond on a portion where said integrated circuit on said printed circuit board is located, prior to spreading the flux.

7. The method of claim 1, further comprised of said optical beam corresponding to a xenon (Xe) light beam used for soldering all leads of said integrated circuit to the lead pattern of said printed circuit board.

8. A method for mounting an integrated circuit of a tape carrier package on a printed circuit board, comprising the steps of:
    loading a printed circuit board having a lead pattern for electrical connection, on a mounting position of a jig;

removing contaminating substance from said printed circuit board;

spreading a flux on a lead pattern of said printed circuit board;

aligning the conduction leads of an integrated circuit of a tape carrier package, with the lead pattern on said printed circuit board over which the flux is spread, and temporarily fixing some conduction leads of said integrated circuit to the lead pattern of said printed circuit board;

irradiating an optical beam of high intensity on said integrated circuit mounted on said printed circuit board to solder all conduction leads of said integrated circuit on the lead pattern of said printed circuit board;

cooling said integrated circuit mounted on said printed circuit board; and unloading said printed circuit board having said integrated circuit mounted thereon from the mounting position of said jig.

9. The method of claim 8, further comprising a step of recognizing the position of the lead pattern on said printed circuit board where the flux is to be spread, prior to spreading the flux.

10. The method of claim 8, said step of aligning and temporarily fixing the leads of said integrated circuit further comprising the steps of:

recognizing the position where said integrated circuit is to be mounted on said printed circuit board over which the flux is spread;

aligning the leads of said integrated circuit with the lead pattern on said printed circuit board over which the flux is spread;

determining whether alignment is accurately completed using a vision system; and temporarily soldering some leads of said integrated circuit to the lead pattern of said printed circuit board to prevent the leads of said integrated circuit from misalignment.

11. The method of claim 8, further comprised of the position of said printed circuit board where said integrated circuit is to be mounted being recognized using a recognition mark on said printed circuit board.

12. The method of claim 8, further comprising a step of spreading a conductive bond on the portion of said printed circuit board where said integrated circuit on said printed circuit board is located, prior to spreading the flux.

13. The method of claim 8, further comprised of said optical beam corresponding to a xenon (Xe) light beam used for soldering all leads of said integrated circuit to the lead pattern of said printed circuit board.

* * * * *